United States Patent [19]

Connell et al.

[11] 4,310,614

[45] Jan. 12, 1982

[54] METHOD AND APPARATUS FOR PRETREATING AND DEPOSITING THIN FILMS ON SUBSTRATES

[75] Inventors: G. A. Neville Connell, Cupertino; Richard I. Johnson, Menlo Park, both of Calif.

[73] Assignee: Xerox Corporation, Stamford, Conn.

[21] Appl. No.: 21,731

[22] Filed: Mar. 19, 1979

[51] Int. Cl.³ .............................................. B05D 3/06
[52] U.S. Cl. .................................... 430/271; 118/723; 118/719; 118/720; 118/730; 427/38; 427/251
[58] Field of Search ................... 427/38, 39, 40, 76, 427/109, 124, 53, 251; 346/76 L, 135.1, 137; 118/719, 720, 723, 730, 50, 50.1; 430/271

[56] References Cited

U.S. PATENT DOCUMENTS

| | | | |
|---|---|---|---|
| 2,373,639 | 4/1945 | Turner . | |
| 2,467,953 | 4/1949 | Bancroft et al. | 134/1 |
| 2,752,882 | 7/1956 | Heimann | 118/723 |
| 2,799,600 | 7/1957 | Scott | 427/109 |
| 2,997,979 | 8/1961 | Tassara | 427/251 |
| 3,069,286 | 12/1962 | Hall | 427/40 |
| 3,288,638 | 11/1966 | Van Paassen et al. | 427/40 |
| 3,326,177 | 6/1967 | Taylor | 118/719 |
| 3,402,073 | 9/1968 | Pierce et al. . | |
| 3,472,685 | 10/1969 | Marfaing et al. . | |
| 3,565,686 | 2/1971 | Babcock et al. | 427/76 |
| 3,632,439 | 1/1972 | Deklerk | 427/38 |
| 3,889,632 | 6/1975 | Brunner et al. | 118/730 |
| 3,913,520 | 10/1975 | Bers et al. | 427/38 |
| 3,914,836 | 10/1975 | Hafner et al. | 427/38 |
| 3,921,572 | 11/1975 | Brunner et al. | 118/730 |
| 3,936,839 | 6/1976 | Freller | 427/251 |
| 3,939,798 | 2/1976 | Morton | 118/7 |

FOREIGN PATENT DOCUMENTS

| | | |
|---|---|---|
| 1796053 | 8/1967 | Fed. Rep. of Germany . |
| 72960 | 5/1970 | German Democratic Rep. . |
| 95162 | 1/1973 | German Democratic Rep. . |
| 1131189 | 10/1968 | United Kingdom . |
| 1518911 | 7/1978 | United Kingdom . |

OTHER PUBLICATIONS

Maissel et al., *Handbook of Thin Film Technology,* McGraw-Hill Book Co., New York, pp. 6–41, 6–42, (1970).

Williams et al., "Materials Research Bull.", vol. 14, pp. 59–65, (Jan. 1979).

Holland, *The Properties of Glass Surfaces,* John Wiley & Sons, Inc., New York, (1964), pp. 310–335.

*Primary Examiner*—John H. Newsome
*Attorney, Agent, or Firm*—W. Douglas Carothers, Jr.

[57] ABSTRACT

Deposition of continuous pin-hole free tellurium films with thicknesses to less than 150A on a suitable substrate is achieved by first pretreating the substrate prior to film deposition. Ion sputtering or bombardment of the substrate surface with an inert gas prior to tellurium evaporation creates a dense coverage of nucleation sites on the substrate which improves the adhesiveness and resistance to abrasion and oxidation of the deposited film while providing very thin pinhole free films of uniform thickness and desired crystallite orientation.

28 Claims, 16 Drawing Figures

METHOD AND APPARATUS FOR PRETREATING AND DEPOSITING THIN FILMS ON SUBSTRATES

This invention relates to the deposition of thin films on suitable substrates and more particularly to the pretreatment of substrates for the deposition of thin films.

In recent years there has been significant interest in the development of ablative optical recording mediums for permanent storage of data by means of a modulated laser beam which selectively ablates a thin film material having a high energy absorbing characteristic provided on a suitable substrate. One such thin film material is tellurium, which is disclosed extensively in the technical and patent literature, such as, U.S. Pat. No. 4,000,334. Tellurium is one of the most preferred materials for an ablative material because of its high sensitivity relative to other successfully ablative materials.

Conventionally known methods of depositing thin layers of tellurium on a substrates has been by sputtering or vapor deposition techniques. However, thin films below 300 to 400 A have generally been plagued with pinholes and other film discontinuities and have exhibited poor film thickness, uniformity and adhesion and have not been adaptable for commercialization.

Some materials do not adhere to various types of dielectric substrate materials with standard deposition methods. Tellurium is one such material. The principle reason for this difficulty is that the substrate material has no means for a chemical and/or physical reaction between the metal being deposited and the substrate material to provide the desired adhesiveness.

Precoating the substrate with a discontinuous thin gold layer prior to tellurium deposition has been applied to improve film adhesion. However, for films below 200 A, the films exhibit pin-holes and nonuniformity in thickness.

It is desirable to produce very thin films of this ablatively sensitive material to thereby (1) maximize sensitivity, (2) minimize the effect on sensitivity that may result from employing a protective overcoating (3) minimize the effect of thickness variations of the writing layer on the recording disc relative to writing sensitivity and (4) maximize the signal noise ratio upon readout.

What is, therefore, desired is the ability to deposit continuous (pin-hole free) and uniformly thick ablative films, such as, tellurium, on substrate materials where materials wherein film thicknesses are 150 A or less, such films exhibiting good adhesion and abrasive resistance qualities for adaptability as commercially employed optical recording mediums.

SUMMARY OF THE INVENTION

According to this invention, a method and apparatus is devised wherein thin films, such as, tellurium films of thicknesses less than 150 A, may be easily deposited on substrate surfaces by first, pretreating the substrate surface to create nucleation sites on the surface and thereafter deposit a thin metallic film of uniform thickness and free of pin-holes. We have found that if the substrate upon which the thin film is to be deposited is pretreated in the manner herein disclosed, the adhesiveness and abrasive resistance qualities of the subsequently deposited thin film are greatly improved rendering it useful as an optical recording medium with excellent archival properties.

The proscribed pretreatment may be provided by an ion bombardment derived from dc or rf plasma or from an ion beam source.

In the preferred embodiment, the pretreatment and film deposition of substrates are carried out in a low pressure vacuum chamber which is provided with a working, nonreactant gas environment, such as, argon. The substrate to be pretreated may be disk-shaped and is mounted in the chamber for rotational movement. A pair of annular planar electrodes, acting as anode and cathode, are mounted in the chamber in spaced parallel relation with their planar surfaces parallel to the surface of the substrate to be pretreated. One of the electrodes, the cathode, is mounted to be in close relationship to the substrate surface. A voltage is applied across the electrodes. By means of controlling the relationship of the working gas flow rate, the pressure in the chamber and the anode-cathode voltage, an effective and sufficiently energic plasma is generated in the system chamber. Ions from the plasma are accelerated toward and into the surface of the substrate due to the established potential difference between the electrodes. The bombardment of the substrate surface by ions removes substrate material and creates the nucleation sites on the substrate surface. Uniform pretreatment is obtained over the surface of the substrate by rotation of the substrate in the chamber during ion bombardment.

Evaporation of the thin film follows pretreatment, by extinguishing of the plasma and evacuating the chamber of the working gas environment. The chamber pressure is then reduced to the lowest obtainable vacuum and the evaporation is initiated. A thin film, such as, tellurium, may be deposited on the rotating substrate by means of evaporation in the same chamber without breaking vacuum. A secondary shield and special apertured mask may be employed to provide for uniform deposition on the rotating substrate surface.

In the preferred form of the apparatus, the pretreatment may be carried out in one location of the chamber and deposition by evaporation may be carried out in another location of the chamber, the surface of the substrate upon rotation, being exposed to each of these locations.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Several embodiments are now described within which the method of this invention may be practiced. Due to the fact that some components of each embodiment are identical and function in the same manner, they will be initially described and then identified with the same numerals in later described embodiments without additional description. Thus, the initial description of these components applies to later described embodiments.

Figure 1:
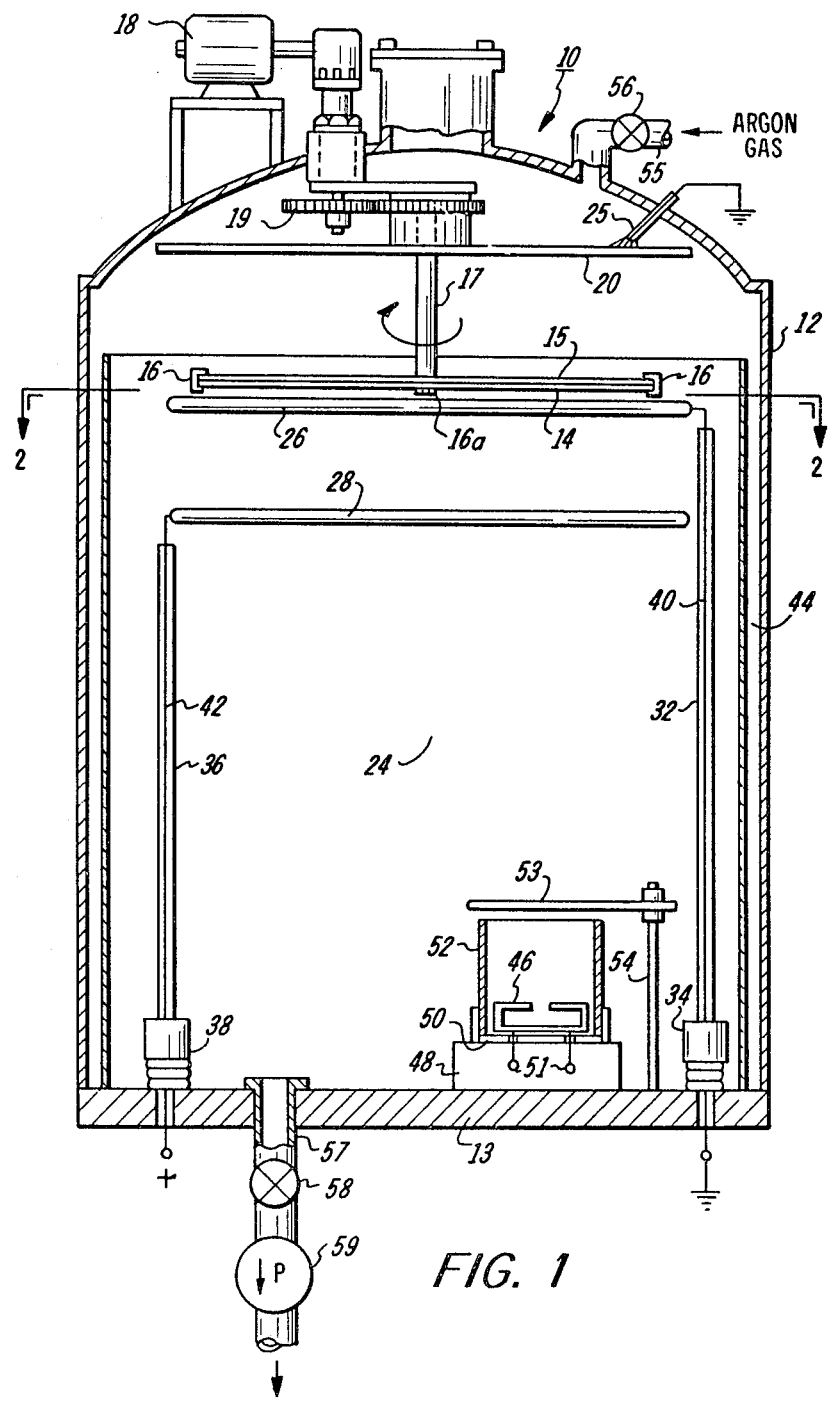
FIG. 1 is a cross-sectional view of one embodiment of the apparatus for carrying out the method of this invention.

Referring to FIG. 1, one embodiment for carrying out the method comprising this invention is shown. Apparatus 10 comprises a suitable bell jar 12 on base plate 13. Bell jar 12 is provided with convenient means for access. A bell jar system suitable for the present invention with certain modifications is manufactured by CHA Industries of Menlo Park, Calif.

Apparatus 10 provides both an environment for substrate pretreatment and film deposition in the preparation of thin films, such as tellurium, on substrates.

A suitable substrate 14 is supported in bell jar 12 for treatment. Suitable materials for substrate 14 are plastics, such as, plexiglas, cast acrylic, polyamide, such as, Kapton and Mylar, and conventional types of glasses. Substrate 14 is supported on a metal backing plate 15 by suitable means, such as, releasable fastening clips 16 and/or by a center bolt 16a. Plate 15 is secured to a rotatably support shaft 17 which is driven by drive motor 18. Drive motor 18 is mechanically coupled to drive shaft 17 through an offset drive assembly 19. An annular shaped top shield 20 is secured to rotate with shaft 17. This shield protects the top of the jar 12 and the associated structure rotatably supporting the substrate 14 from contamination by deposition vapors developed in the main chamber 24 during substrate processing.

A grounding brush 25 is secured to a wall of the jar 12 and positioned to be in contact with the upper surface of shield 20 while the latter is rotated. Brush 25 is maintained at ground reference so that backing plate 15 is also at ground. For this grounding purpose, plate 15, shaft 17 and shield 20 are all fabricated from a metal, such as, aluminum. Grounding aids in controling the plasma established in chamber 24.

Figure 2:
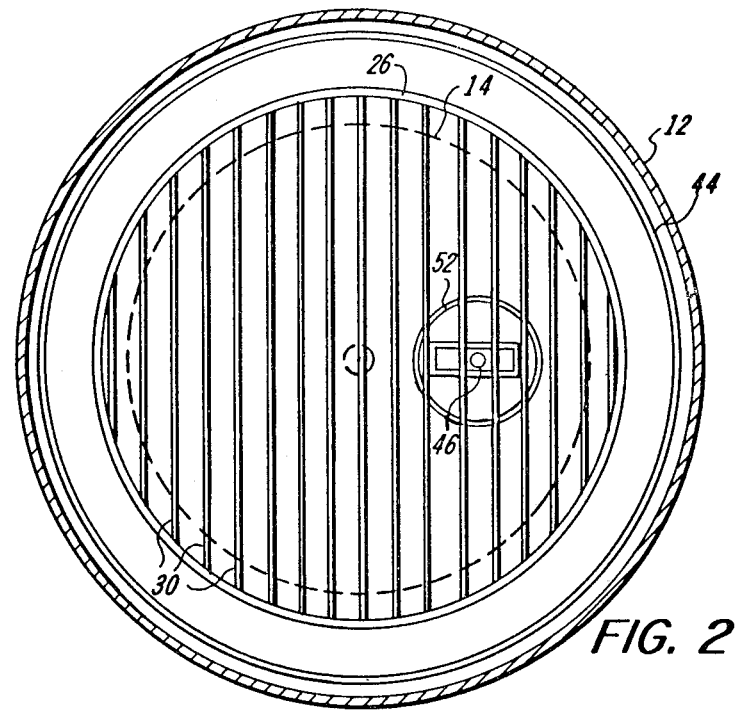
FIG. 2 is a cross-sectional view taken along line 2—2 of FIG. 1.

Chamber 24 includes a pair annular shaped planar electrodes 26 and 28. Electrode 26 is the cathode while electrode 28 is the anode in creating a plasma in the chamber 24. Each electrode is provided with a plurality of parallel grids 30 as best shown in FIG. 2. The grids 30 may be in aligned relationship relative to both electrodes 26 and 28.

Electrode 26 is supported by an aluminum rod 40 supported from a base insulator 34 whereas electrode 28 is supported by an aluminum rod 42 supported from base insulator 38. Insulators 36 and 38 are secured to base plate 13. Electrodes 26 and 28 are electrically connected by rods 40 and 42, respectively, to a voltage source (not shown). Rods 40 and 42 have glass sleeves 32 and 36 to insulate them from the plasma.

In order to reduce contamination on the side walls of jar 12 during the deposition process, a cylindrical shield 44 is provided in chamber 24. Shield 44 may be of any material that is suitably inexpensive and would not interfere with the operation of the pretreatment and deposition phases of the system. It must be a stable material at high temperature within a vacuum. Polyamide material is a suitable material. When shield 44 is extensively covered with deposited tellurium, it may be removed from chamber 24 and replaced with a new shield. The tellurium deposits on the shield may be recovered for reuse.

A container 46 is provided for holding the source during evaporation. Container 46 is positioned on a platform 48 supported on base plate 13 and is provided with a heater 50 having supply leads 51. The container 46 is surrounded by a cylindrical shield 52. A shutter 53 is rotatably supported from rod 54 to open and close off the source 46 or control the amount of evaporative material emitted from source 46.

During vapor deposition, the metallic vapor will be confined by the shield 44 and deposition of the evaporant is carried out through the electrodes 26 and 28. These electrodes are not in use during deposition. It is within the contemplation of the present invention to provide openings in the grids 30 of electrodes 26 and 28 directly above source container 46 to minimize any shadowing effects.

A low pressure gas environment is employed during the pretreatment process. Gas inlet 55 is provided with a needle valve 56. Evacuating outlet 57 is provided with system valve 58 and a system evacuating pump 59.

The method comprising this invention to produce highly adhesive thin films comprises a pretreatment step and a deposition step. Pretreatment of the substrate 14 is carried out first. Substrate 14 is rotated continuously during both processing steps. While the rotational speed is not critical, a suitable rotational speed is above 15 rpm, depending on the type of pretreatment source and the amount and length of time of the pretreatment desired. A DC plasma is created and maintained in chamber 24 by means of the annular planar electrodes 26 and 28. The creation of the plasma depends largely upon proper anode and cathode separation, gas pressure in the evacuated chamber and electrode voltage. Typically for this embodiment, the electrodes 26 and 28 may be about 10 cm apart, the electrode 26 may be about 1 cm from the surface of substrate 14, the chamber pressure may be 5 m torr and the voltage applied to the anode electrode 2,000 to 4,000 volts.

It should be noted that the plasma necessary for the pretreatment step of this invention must be an energetic plasma wherein a portion of the ions created in the plasma reach some threshold level of kinetic energy. Due to the high voltages applied to sustain the plasma and the low pressure environment, highly energetic ions and electrons in the plasma have high mobility and considerable kinetic energy. With the aid of cathode electrode 26, the ions are accelerated at high rates of speed with sufficient kinetic energy so as to slam into the substrate 14 and cause the removal of material from and the creation of nucleation sites on the substrate surface. Thus, the plasma employed here is not the conventionally used plasma or glow discharge wherein the ions normally do not have sufficiently high energy levels to sputter surfaces but rather are for only cleaning surfaces.

The cathode electrode 26 is preferably positioned very close to the substrate 14, such as, 1 cm or less. The function of electrode 26 is to cause the bombardment of the substrate surface with the charged ions which, in turn, sputter the substrate surface. Electrode 26 acts as an accelerating and collimating device for the plasma ions.

Ground brush 25 to a large extent aids in confining the plasma between electrodes 26 and 28 although portions of the plasma may extend throughout the chamber 24.

The chamber 24 is evacuated by pump 59 after which valve 56 is opened to permit the introduction argon gas into the chamber. By raising the applied voltage above some critical value on the anode electrode 28 and lowering of the pressure in chamber 24 by means of operation of both valves 56 and 58 with continuous pumping by pump 59, an effective plasma may be generated in chamber 24.

Many inert gases may be employed in the system. However, heavier gases, such as, argon and krypton, are preferred.

Upon initiating a plasma in chamber 24, a threshold voltage value must be reached and maintained. This conditioning threshold value is a voltage at which ion bombardment or sputtering begins to break the surface bonds of substrate surface. The heavy argon ions are accelerated from the plasma created between the electrodes 26 and 28 into the substrate surface. This conditioning treatment is carried on for a sufficient period of time to provide a dense coverage of nucleation sites on the surface of the substrate. Typically, the times may be from less than a minute to approximately 10 minutes. As an example, 100 A to 200 A of surface material may be removed in approximately 10 minutes depending on the plasma conditions and substrate material being treated.

The parameters of the preconditioning treatment will vary according to the substrate material used. The threshold voltage will be higher for glass material than plastic material. What is to be accomplished is to cause surface sputtering of the substrate as well as surface cleaning. For acrylic substrates, the potential applied to anode electrode may be about 600 volts whereas for glass substrates the anode voltage may be as high as 4,000 volts. This range of voltage is representative of critical voltage values used to obtain the desired treatment of a particular substrate surface.

After pretreatment, a short cooling period is provided and, then, the evaporation source 46 is heated until there is suffcent vapor or sublimation of the source material. The evaporation rate is controlled by the amount of current supplied to heater 50. By employing sensing devices, the thickness of the thin film deposited on the rotating substrate 14 can be monitored.

The film thickness depends on the source temperature, the time period of evaporation, the distance from the source 46 and the substrate 14.

Pinhole free and continuous thin films below 150 A in thickness can be achieved having thickness uniformity throughout the film.

In particular, pin-hole free, continuous and uniformly thick tellurium films can be deposited on plastic and glass substrates at thicknesses below 100 A. Such thin films have thus far been achieved down to 25 A with these film properties.

A very important aspect in tellurium deposition of thin films is that the method of the present invention provides tellurium thin films below 100 A that have the c-axis of the tellurium polycrystallites randomly oriented in the plane of the substrate and, therefore, are optimum for ablation recording when employed in an optical recording and playback system. Furthermore, with the c-axis orientation of the polycrystalites in the plane of the film layer and substrate, the tellurium thin film will not readily oxidize. In single crystal tellurium, oxidation occurs readily in the c-axis direction but is virtually nonexistent in a direction normal to the c-axis.

Crystal orientation has been a particular problem in employing tellurium as an optical recording medium. Prior deposition techniques have not been successful in obtaining very thin films of tellurium wherein the crystalites are all oriented in the c-axis. Rather, crystal orientation has been in random directions relative to the plane of the film. With this kind of crystalline orientation, tellurium will readily oxidize, making it highly undesirable as an optical recording medium. Over a relatively short period of time, the film will deteriorate due to oxidation. The archival property of tellurium thin films achieved by the present invention has been found to be very good. If optical recording mediums are prepared according to the method used herein, accelerated lifetime testing has shown that these mediums will last indefinitely under ambient conditions.

Although the exact phenomena occurring in the present method to produce very thin films of tellurium on substrates is not completely clarified from a physical and theoretical standpoint, it is believed that the described combination of a ion-bombardment pretreatment performed on the surface of the substrate followed by a vapor deposition of the desired material employing the embodiments disclosed, with attention to the dispersion function relative to deposition rate and the nature of the substrate material being employed, a medium is provided that has the desired c-axis orientation of the polycrystalities.

The thin films produced have excellent adhesion quality to the substrate and are highly abrasive resistent. Films produced have passed the crude but simple "Scotch tape" test for adhesion and "Q-tip" test for abrasion. The application of adhesive tape to the thin tellurium film and its removal therefrom, whether quickly or slowly, will not remove the film from the substrate. The drawing of a cotton swab Q-tip across the surface of the thin film does not cause any damage to the thin film or its surface.

Still another advantage of the method of the present invention is the avoidance of sputtering of thin films, which is a difficult deposition method to employ and control where very thin films are desired on various different types of substrates. Evaporation deposition is easier to control and provides the film qualities mentioned above as well as the desirable crystalite orientation.

One may inquire at this point as to the importance of producing such thin films as an optical recording medium. In the ablation process, material removed from the circular opening made in the film is piled up in the form of a torus around the opening. The energy needed to do this is less for thinner films. If an overcoating is present for the purpose of protecting the film, extra work must be done in moving the torus against the overcoat. The amount of work necessary to create such a torus against the surface of the overlayer is a direct factor on ablation sensitivity. The thicker the film, the higher the torus formed necessitating more work and, thus, reducing ablation sensitivity. Since the torus height is smaller for thinner films for a fixed hole size, the ablation sensitivity for thinner films is less effected by the overcoating. Thinner films also minimize differences in writing sensitivity caused by thickness variations thereby making production of these mediums easier.

Thin films of tellurium have much greater writing sensitivity than thin films of bismuth, i.e., threshold power values to provide film openings may be as much as three times less than that required for bismuth. Using an argon laser emitting at a 5145 A wavelength, ablation tests for thin tellurium films, 150 A thick, on cast acrylic substrates produced in accordance with the present invention have shown threshold power of 1.5 mW with pulse lengths 100 nsec (acceptable for good read after write capability) and have produced film openings having a diametrical extent of 0.4 μm. Further laser power at 5 mW for the same pulse lengths produced film openings of 0.8 μm. Where the substrate is glass, the employed threshold power was 3 mW producing openings of 0.2 μm. Also it has been observed that writing time does not vary widely with laser power using thin film media and is always less than 200 nsec. Hole size increases with laser power and energy supplied.

One reason that tellurium is an excellent optical recording medium is that its thermal conductivity is poor and there is very small radial heat loss on writing.

Another reason that tellurium is an excellent optical recording medium is that the temperature melting point and boiling point are in close proximity as compared to other optical recording materials. The closer these two temperature points, the smaller the laser energy levels required to make an opening and the more control one has over the size of the opening desired. Obviously, these conditions depend on the thickness of the tellurium and the substrate material. Desirable materials should have low thermal conductivity or poor heat absorption qualities.

Figure 3:
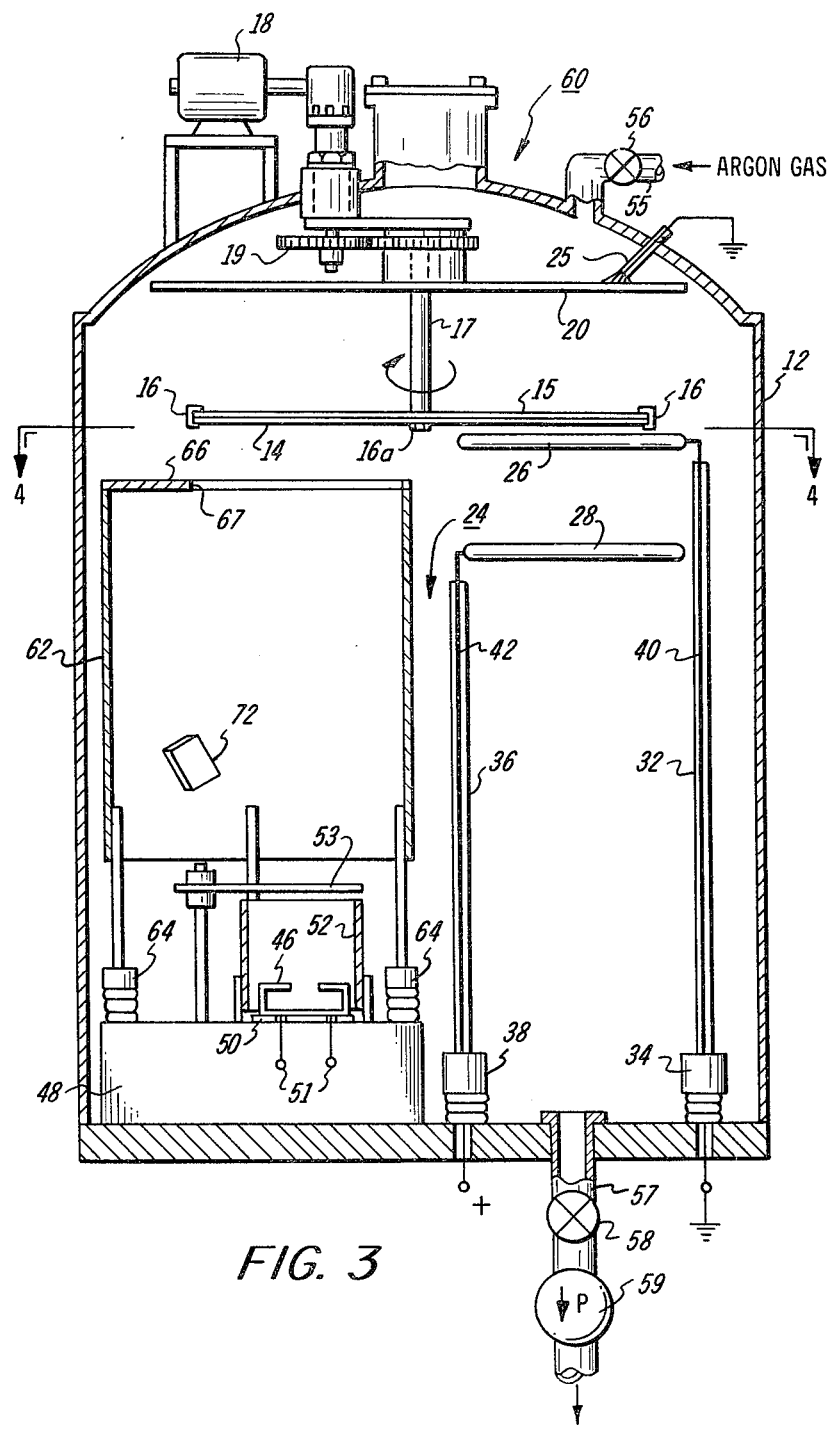
FIG. 3 is a cross-sectional view of another embodiment of the apparatus for carrying out the method of this invention.

In FIG. 3, apparatus 60 is similar in operation to apparatus 10 except that pretreatment step and the deposition step are carried out in different regions of chamber 24 of bell jar 12. Electrodes 26 and 28 are of smaller diameter and positioned in parallel relationship to cover a substantial portion of the radial extent of substrate 14 in one region of chamber 24. The other region of chamber 24 is provided with deposition equipment including the platform 48 and the evaporation source and container 46. The deposition region also includes a secondary shield 62 insulated from ground by means of support insulators 64. The shield 62 may be fabricated from metal. By insulating the shield from ground, it provides a poor conductor path for established plasma current in the pretreatment region of chamber 24 to insure that planar electrode 26 is the major source to ground and, therefore, the major focal point for accelerating ions to the substrate surface. Chamber 24 should be large enough, however, to provide sufficient separation between the shield 62 and the electrodes 26 and 28 and thereby prevent operational interference by the shield 62 with the plasma. The secondary shield 62 is constructed to be easily removable from chamber 24 in order to retrieve deposited tellurium or other evaporated materials from the inside surfaces of the shield for reuse. Also, the shield 62 functions to prevent surface contamination of the bell jar 12 and other components in chamber 24.

Figure 4:
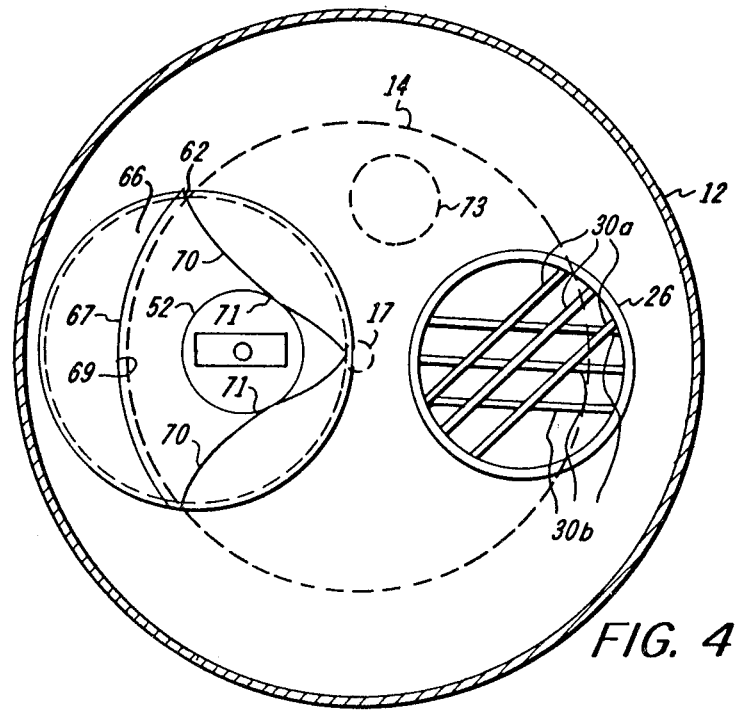
FIG. 4 is a cross-sectional view taken along the line 4—4 of FIG. 3.

As best seen in FIG. 4, the upper end of secondary shield 62 is provided with a mask 66 having an aperture 67 through which the vapor may travel for deposition at a desired rate over a portion of the rotated substrate surface. Aperture 67 increases in a monotonic manner from an inner position 68 adjacent the center of the substrate to the outer rim position 69. The sides 70 of aperture 67 have a concave-convex shape. It has been discovered that with an aperture of this design and shape, the substrate surface can be provided with a highly uniform film deposition during its rotational movement in the deposition step.

The aperture shape takes into account the difference in evaporation distribution from the center of and extending radially outward from the source 46, thus, the apex points 71 of convex shaped sides 70 are substantially directly above the center of source 46.

Figure 9:
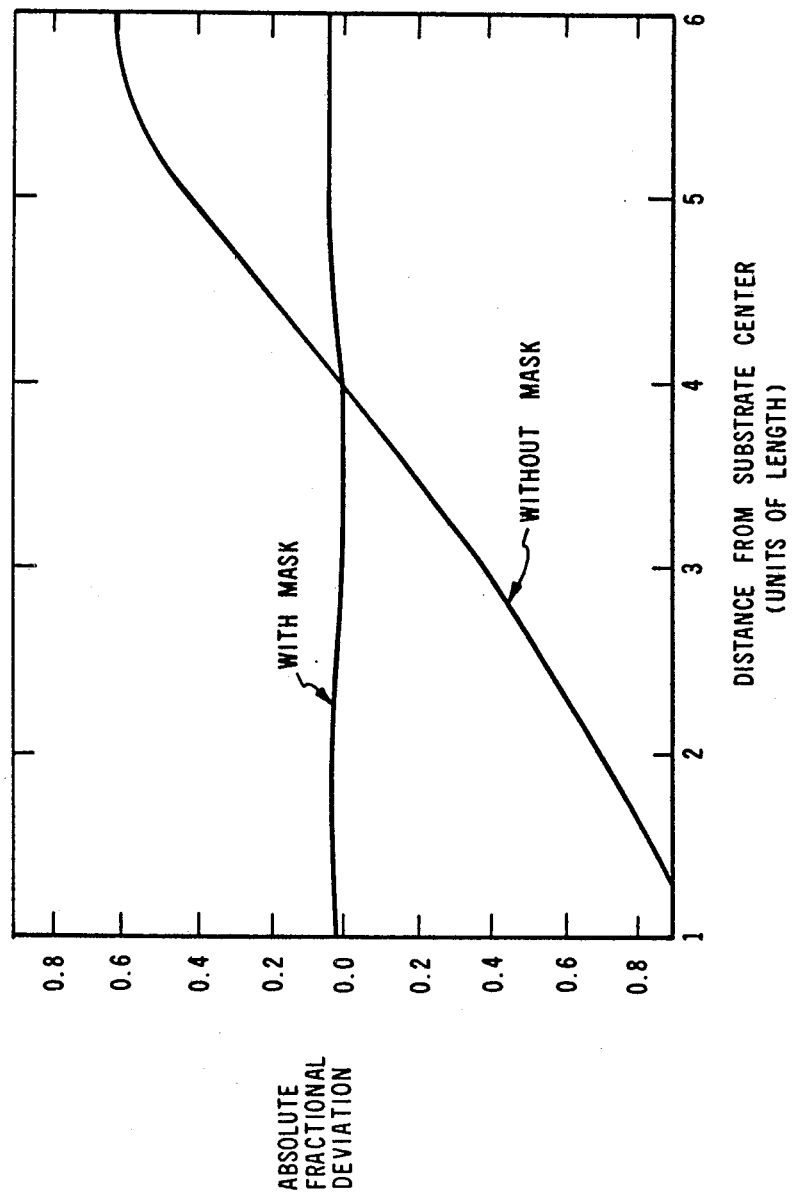
FIG. 9 is a graphical representation of the absolute fractional deviation of film thickness as a function of distance across the substrate surface, in one case where masking is employed during deposition and in another where masking is not employed during deposition.

The uniformity of film thickness employing mask 66 with an aperture 67 has been controlled to plus and minus 2.5% or less over the entire surface of the substrate. This is illustrated in FIG. 9 for this particular aperture wherein deviation in thickness from the center of the substrate 14 to the outer edge of the substrate is practically a straight line. The deviation in film thickness is negligible. Without the mask 66 and shield 62, the deviation in film thickness across the surface of the substrate is quite significant and undesirable.

Mask 66 is positioned close to the surface of substrate 14 and in this illustration is spaced approximately 2.5 cm from the substrate surface.

A sensor 72 is secured to the inner surface of secondary shield 62 and is connected to a conventional monitoring device (not shown) to monitor the rate of deposition to determine the amount of material being deposited on substrate 14.

As shown in FIG. 4, the electrodes 26 and 28 have parallel grids 30, with the upper ground electrode 26 having grids 30a and the lower anode electrode 28 having grids 30b. The upper grids 30a are disposed at an angle relative to lower grids 30b. The amount angular disposition of grids 30a relative grids 30b controls the extent of coverage of the concentrated ion beam created from the established plasma and focused on the surface of the substrate. This is illustrated in FIG. 5.

Figure 5A:
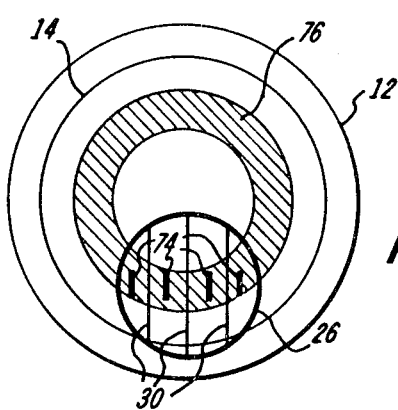
FIGS. 5a and 5b are schematic representations pertaining to electrode orientation of the electrode arrangement shown in the embodiment of FIG. 3.

In FIG. 5a, both electrodes 26 and 28 have their grids in radial alignment. The spots 74 represent the area of maximum coverage on the substrate surface by the focus argon ions. The upper grounded electrode grids 30a are analogous to a cylindrical lens in collimating the accelerated ions into ion beams having a pattern at the substrate surface illustrated at 74. Pretreatment will be performed on the substrate surface in the format an annulus 76 of the radial width shown due to the beam sweeping via patterns 74 as the substrate 14 is rotated.

Figure 5B:
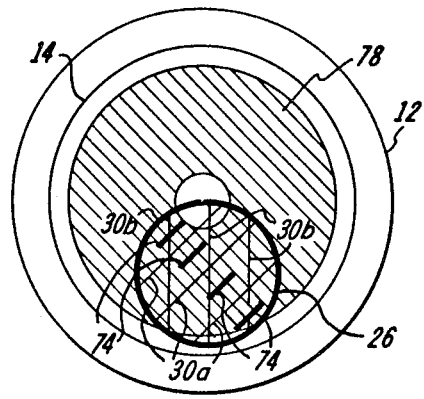

The radial width of this pattern will increase by turning the focusing grids 30a diagonally relative the radius substrate 14. The greater the angle, the greater the beam sweep extent and, therefore, the greater the area of substrate surface treated. When the angular relationship is approximately 45°, as illustrated in FIG. 5b, the surface treated will have form of annulus 78, which has a much larger radial extent than the annulus 76. Thus, the radial extent of surface treatment of the substrate 14 may be easily controlled to fit a particular need.

In this embodiment, electrode 26 is approximately 1 cm from the surface of substrate 14 and electrodes 26 and 28 are approximately 8 cm apart.

Apparatus 60 is preferred over apparatus 10 for three principle reasons. First, all surface portions of the substrate 14 that are to be pretreated receive a more intense and thorough collimated ion beam sweep established from a more concentrated plasma as the substrate is rotated.

Secondly, any positive charge that develops on the substrate surface due to ion bombardment can be more easily neutralized by free electrons in chamber 24 outside the intense plasma pretreatment area. As the just treated portions of the substrate leave the ion bombardment region of electrode 26, free electrodes created from the plasma and present in chamber 24 are attracted to these positively charged surfaces. Neutralization can occur continuously until these particular surfaces are again brought by rotation into the pretreatment region. Thus, a good deal of neutralization may occur in the deposition region of chamber 24. Thus, rotation is desired to allow time during each revolution of the substrate from the bombardment surface to discharge by electron capture from the plasma.

Third, the vapor deposition can be accomplished with no interference from electrodes 26 and 28 aiding in provision of more uniform film thickness. It has been noted that much improved adhesion of thin tellurium films onto glass substrates have been obtained and variations in film thicknesses reduced due to the separation of the pretreatment and deposition functions separate regions in chamber 24.

Representative threshold voltage values for apparatus 60 to properly sputter the substrate surface after plasma establishment and stability for various substrate materials for a current of 500 mA have been found to be approximately 0.5 KV for acrylics, 1.5 KV for Kapton, 1.5 KV Mylar and 2.5 KV for glass. The treatment may be carried on for about 10 minutes.

The preferred deposition rate at the source for apparatus 60 is about 7 A per second to provide the desired c-axis orientation. Obviously other deposition rates are suitable for this particular apparatus. Generally, the preferred range extends from 5 A per second to 20 A per second. Depending on the archival properties desired of the deposited thin film, the range could be extended from about 1 A per second to about 100 A but not without encountering polycrystallites having their c-axis oriented in directions other than plane of the thin film.

Figure 6:
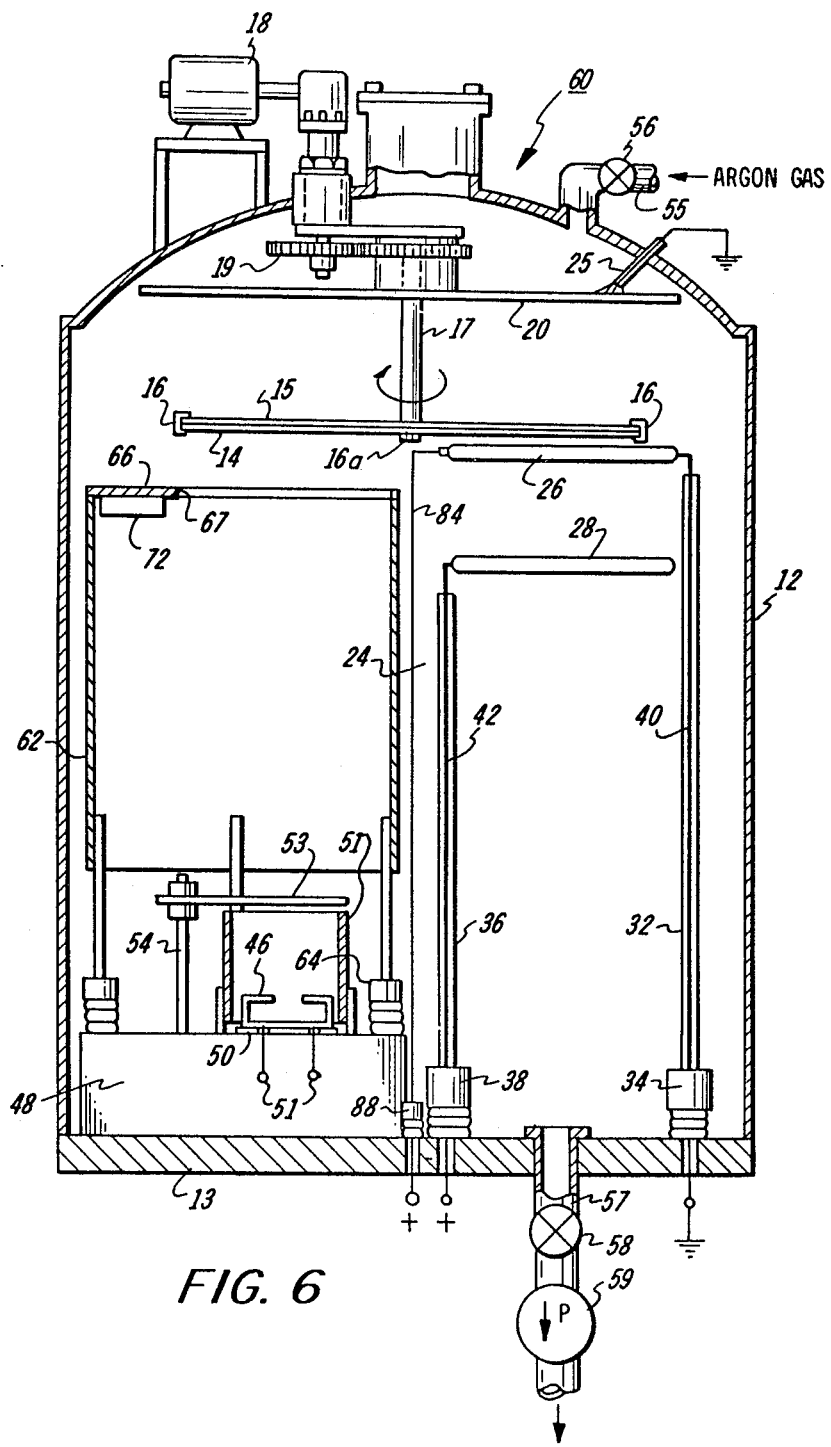
FIG. 6 is a cross-sectional view of the embodiment shown in FIG. 3 employing a thermionic electron source.

Apparatus 80 shown in FIG. 6 is identical to apparatus 60 of FIG. 3 except that ground planar electrode 26 is provided with a heater filament 82. Filament 82 is utilized as an electron emitter for improved stability of the plasma as well as being able to lower the operating chamber pressure at which the plasma can be sustained.

Figure 6C:
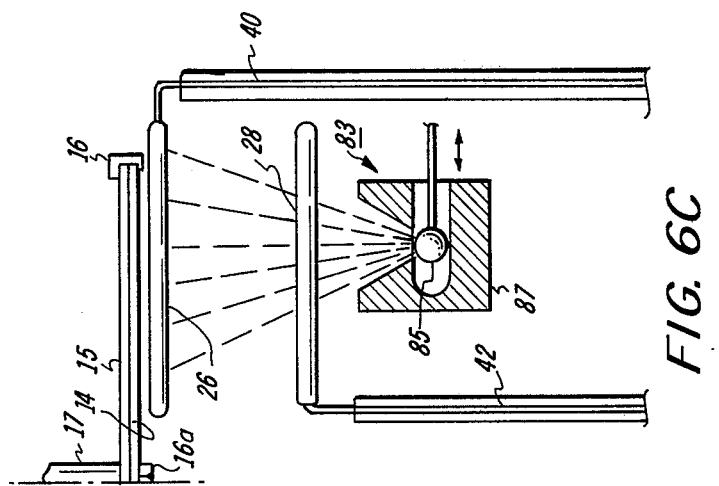
FIGS. 6b and 6c show details of other electron sources that may be employed.
Figure 6A:
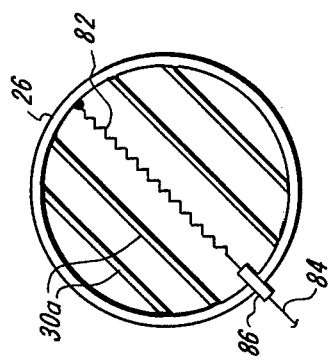
FIG. 6a details the thermionic electron source shown in FIG. 6.

As best shown in FIG. 6a, filament 82 replaces one of the grids 30a of electrode 26 and is connected to lead 84 via a ceramic insulator 86. The other end of filament 82 is connected to ground by merely attaching it to the electrode structure, such as, by means of a screw. Lead 84 is fed through insulator 88 for connection to a low voltage source. Filament 82 may be a tungsten wire having a resistance of about one tenth ohm per cm. Where a filament having a total resistance of 1 ohm is employed with 4 to 5 volts applied thereto, 16 to 25 watts are developed and sufficient heat is generated causing electron ejection from its surface. The applied voltage is sufficiently low so as not to interfere with the plasma. The power developed at the filament is not high enough to overheat or otherwise damage the substrate 14 if the power is kept below 25 watts at the proscribed distances.

Filament 82 is a thermionic electron source in proximity to cathode and anode electrode framework and capable of injecting additional electrons into the plasma created between electrodes 26 and 28. These additional electrons assist in generating more ions from the plasma. This means that with the provision of more electrons in the plasma, more collisions will be encountered between electrons and argon atoms and, as a result, more argon ions are created for treatment of the substrate surface.

The use of this thermionic electron source provides for stability of the plasma operation by making it possible to lower the chamber pressure at which the plasma may be sustained and higher voltages for a given current can be obtained. Also the mean free path of the plasma ions increases with lower chamber pressures. As a result, argon ions encounter fewer collisions along their path while being acceleration toward substrate 14. Also electron emission at cathode electrode 26 contributes to better collimation of the ions by neutralizing the beam. Thus, a more intense ion bombardment of the substrate is possible.

Another feature of electron source 82 is that the emission of electrons has a tendency to neutralize the ion beam and bringing about collimation through electrode 26. Also this source provides additional free electrons for reduction of surface charge on substrate 14. In this connection, additional thermal electron sources could be located in other strategic locations in chamber 24 near the surface of substrate surface to provide for greater reduction of surface charge. Such a location, for example, would be in the area 73 shown in FIG. 4. It is contemplated that the electron emission could be sufficient enough to create a strong negative charge on substrate 14 so that argon ions would be accelerated with greater velocity toward the substrate surface when the substrate surface is in the pretreatment zone.

The filament 82 may be pretreated with a surface material to increase its thermionic electron emission for a given filament temperature thereby providing higher electron emission at lower temperatures.

Figure 6B:
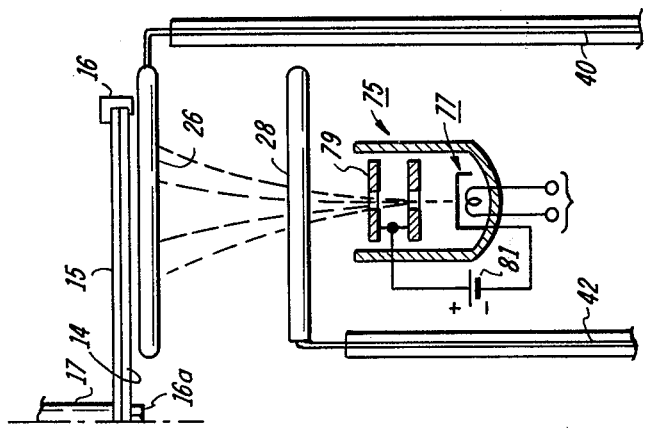

Other types of electron emitters may be employed with the apparatus 60 rather than filament 86. In FIG. 6b, a cathode ray accelerator 75 is shown. Electrons from cathode and filament source 77 may be accelerated by anode 79 and directed as a sweeping beam into the plasma generated between electrodes 26 and 28. The power supply 81 provides voltage to the anode 79, the level of which controls the energy of the emitted electrons. The variance of the current supplied to the filament at source 77 controls the electron intensity.

In FIG. 6c, a pure beta emitter 83 emits high energy electrons and the emission is controlled by movement of the beta source 85 relative to metal shield 87.

Both accelerator 75 and emitter 83 provide an electron source for intensifying ion generation in the plasma between electrodes 26 and 28. Some of the electrons will also proceed through the plasma to the substrate surface and aid in the neutralization of surface charge.

Accelerator 75 and emitter 83 may be provided in other locations of chamber 24 to act as surface charge neutralization means. One such location would be in the region 73 below substrate 14, illustrated in FIG. 4.

Figure 10:
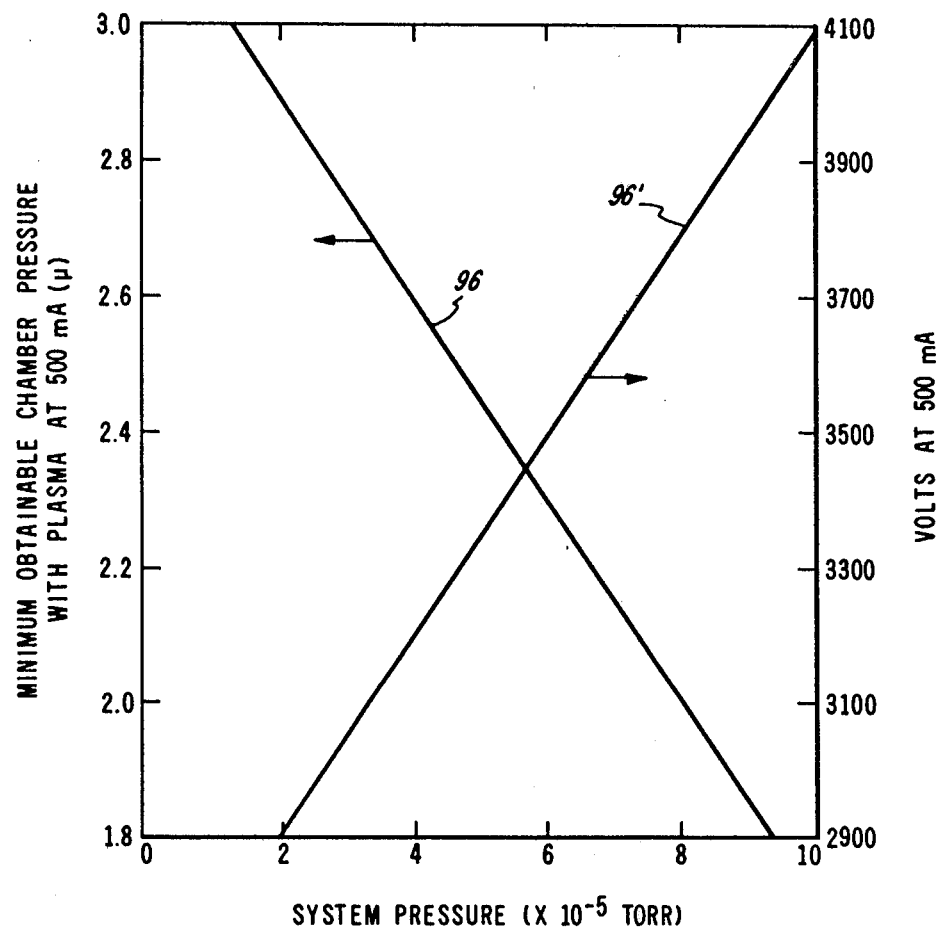
FIG. 10 is a graphical representation illustrating various pressure and voltage requirements in operating the apparatus of FIG. 3 according to the present invention.

FIG. 10 is an example of a "recipe" for creating and operating the plasma during the pretreatment step. This figure shows the conditions, using a glass substrate, for the minimum obtainable chamber pressure that will maintain a plasma at 500 ma versus system pressure, illustrated by line 96 and the maximum obtainable voltage at 500 ma versus system pressure, illustrated by line 96'. Chamber pressure is the pressure within chamber 24. System pressure is related to the gas flow through the system and may be monitored at a point between valve 58 and system pump 59. It is the pressure obtained when valve 58 is open to its full extent. With needle inlet valve 56 closed, the system pressure will be several orders of magnitude lower, such as, in the $10^{-6}$ torr range. As the needle valve 56 is opened, argon is bled into the system and the system pressure will increase. As the valve 58 is closed from its fullest extent, the chamber pressure will increase. By controlling the relationship between the extent of opening of valves 56 and 58, a minimum chamber pressure can be established at which, for a given voltage on electrode 28, will sustain a plasma. With this "recipe", one can adjust the relationship between the chamber and system pressure that will sustain a plasma at given voltage. After establishing the plasma and allowing the system to pass through a short unstable period involving the purging of chamber 24 of water vapor, remaining air molecules, etc., the system pressure can then be decreased while increasing the electrode voltage creating a more intense and energetic plasma.

Figure 11:
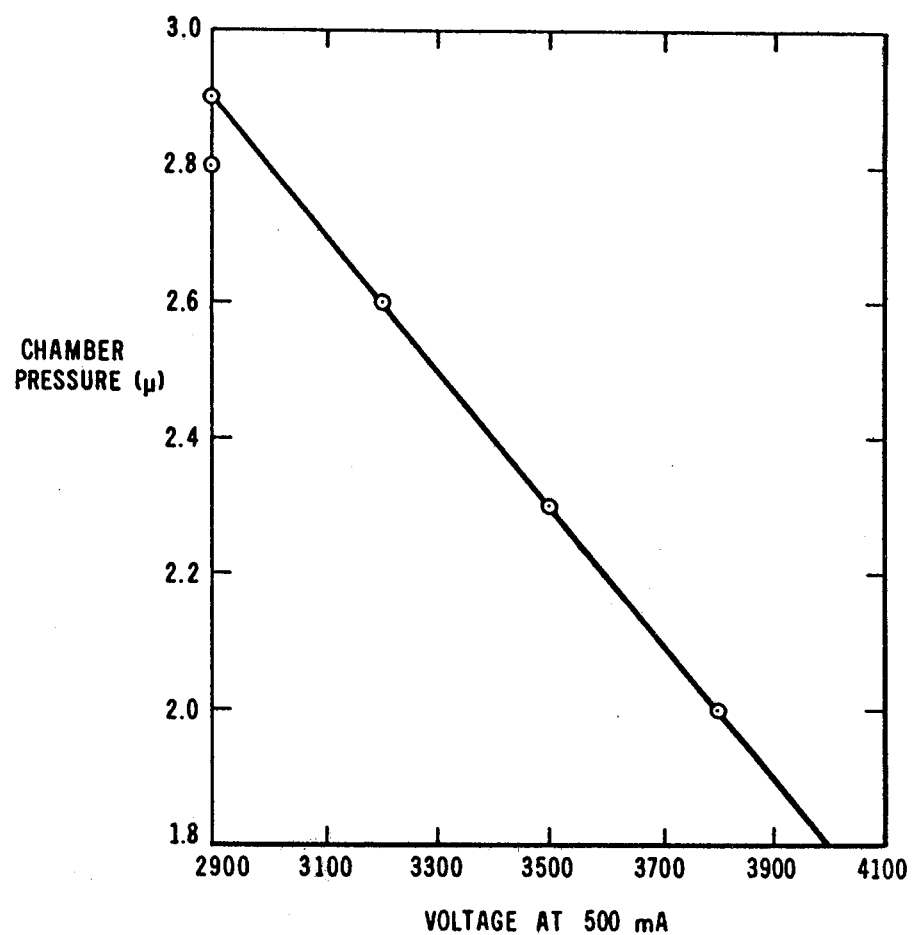
FIG. 11 is a graphical representation illustrating the chamber pressure versus critical voltage values necessary to obtain the desired pretreatment in operating the apparatus of FIG. 3.
Figure 12:
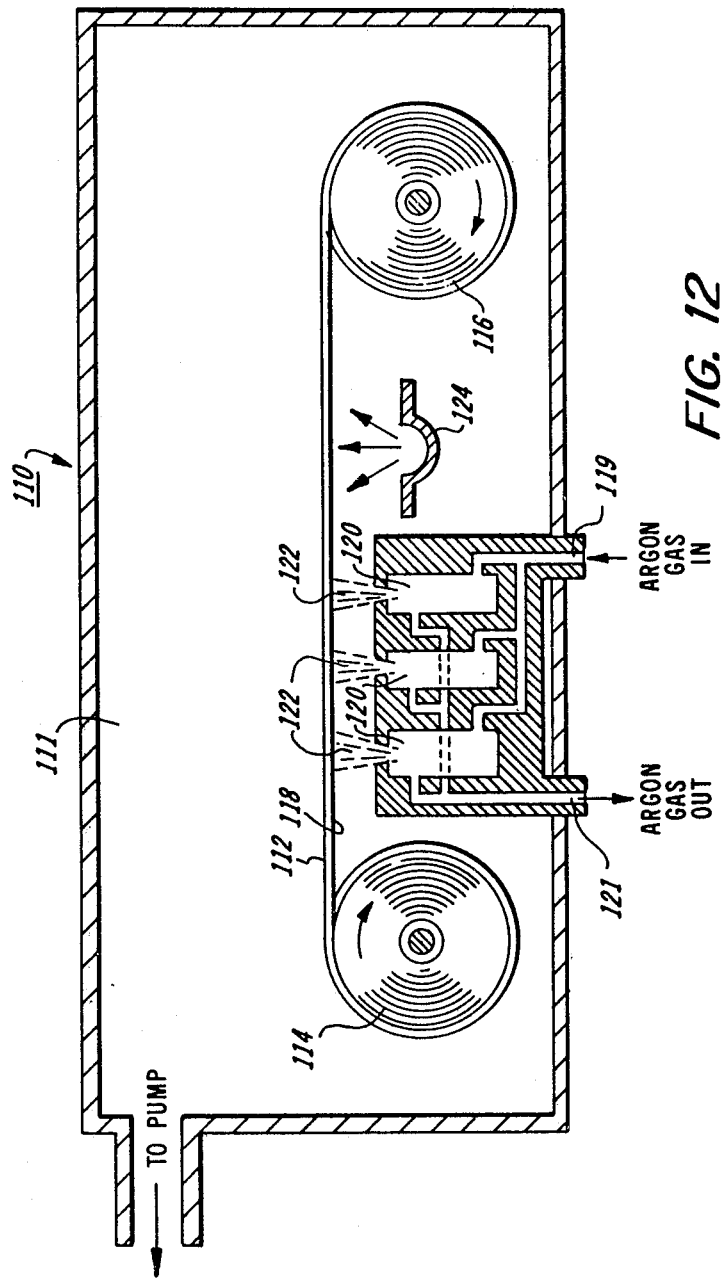
FIG. 12 is a schematic diagram of linear system that may be used for carrying out the method of this invention.

The important factors are the level of voltage applied to the plasma and the lowest obtainable chamber pressure. The voltage establishes the amount of kinetic energy by which the ions are accelerated into the substrate. Increased voltage levels at lower chamber pressures will create a more energetic plasma and greater ion acceleration and increased ion mobility. The relationship of chamber pressure versus critical voltage values for apparatus 60 is shown in FIG. 11.

In order to more fully understand the manner by which pretreatment and deposition are carried out according to the present invention, the following example is given relative to employment of apparatus 60. This example is intended for the purposes of clarity in carrying out attainments of this invention and is not to be construed to limit the invention to any particular form. The basic method of pretreatment and deposition thus far described may also be carried out with each of the embodiments shown in FIGS. 1, 3, 7 and 8.

EXAMPLE I

1. Preparation of Disk Substrate

The surface of the substrate should first be cleansed to remove any foreign particles prior to insertion into the apparatus 60. The substrate choosen is an acrylic material. The substrate may be first swabbed in a detergent solution, rinsed in water and then rinsed in a methanol bath for short periods of time, such as 10 seconds. Thereafter the substrate is again raised in water and may optionally be blown dry. Instead of a final water rinse, an isoproponal rinse may be employed which is preferred for some acrylic substrate materials. Next, the substrate may be baked in oven at approximately 50° C. for a period of time which may be one hour or so. The time is not critical. The substrate should be placed on a ridged support while in the oven to aid in maintaining substrate flatness. The oven time is not critical. Depending on substrate material, the time period may be from one-half hour to several hours.

Before placement of the substrate into apparatus 60, the substrate surface may be blown off with an ion air gun to remove any accumulated dust particles on its surface.

The particular treatment here is not sacrosanct relative to the method of the present invention. There are many preparation techniques in the art for providing a properly cleaned surface on the substrate.

2. Substrate Pretreatment Step

The following explanation is for either plastic or glass substrates. The substrate is secured to the backing plate 15 by means of clips 16 and by center bolting. The system is closed and, with valve 56 closed and valve 58 open, pump 59 is operated until the chamber pressure reaches the $10^{-6}$ torr range or better. Next, the chamber 24 is purged with argon gas by opening needle valve 56 for a few minutes. Depending on the maximum desired plasma voltage, valve 56 is adjusted until the system pressure is between 1 and $10 \times 10^{-5}$ torr as shown in FIG. 9. Most operations of the system have been conducted at about $6 \times 10^{-5}$ torr. The larger the gas flow rate into chamber 24, the lower the minimum obtainable chamber pressure that will maintain a plasma at a specific current. Since the maximum voltage obtainable increases linearly with decreasing chamber pressure, a large argon flow rate through chamber 24 and out through pump 59 will provide a larger obtainable plasma voltage.

For acrylic substrates, a suitable plasma voltage is about 2000 volts. For glass substrates, this value will be higher, such as 3,000 to 4,000 volts. System pressure may be set appropriately for the substrate material employed. These voltages are only representative for the particular apparatus and are not sacrosanct, but they must be greater than the threshold voltage necessary to bring about a sufficiently energentic ion bombardment for the particular substrate material.

Motor 18 is operated to rotate the substrate in chamber 24. Rotation of the substrate 14 is maintained throughout the pretreatment and deposition steps and the revolutions per minute for each step may be the same. A representative rpm for apparatus 60 is 23 rpm. For very short depositions, such as, 25 A films, a faster rate of rotation would be desirable for the substrate.

Next, the plasma is initiated by increasing the anode electrode voltage. After plasma ignition, the chamber pressure and corresponding desired plasma voltage are obtained by adjustment of valve 58 toward its closed position while increasing the voltage on anode electrode 28. The desired chamber pressure obtained is usually the lowest possible that will support the plasma.

The ion bombardment of the plasma substrate surface is maintained for a sufficient period of time to produce nucleation sites uniformly over the substrate surface. This depends again on substrate material but, generally, pretreatment may be from 10 seconds to 20 minutes. In the case of the acrylic and glass substrate, 10 minutes generally provides good results.

3. Substrate Deposition Step. The argon valve 56 is next shut off and the high voltage is removed from electrode 28 and the plasma is extinguished and the system valve 59 is opened to its full extent. The chamber 24 is evacuated until a chamber pressure is in the low $10^{-6}$ torr range while the system is cooling.

The tellurium source 46 is heated to evaporation. With shutter 53 open, the deposition rate is monitored by sensor 72. Depending upon the monitor to target distance, the monitored vapor deposition may be used as an indication of the amount of vapor being deposited on the rotating substrate. The tellurium thin films are prepared at a deposition rate of about 7 A per second through aperture 67, but is about 1 A per second to the substrate surface averaged over each revolution. As previously indicated, the relatively slow deposition rate is important in order to produce films composed of crystallites having their c-axis randomly oriented in the plane of the film.

By following this procedure, uniform and continuous tellurium films have been deposited down to 25 A in thickness, free of pin-holes and having excellent adhesion quality to the substrate surface for normal usage as an optical recording medium.

Figure 7:
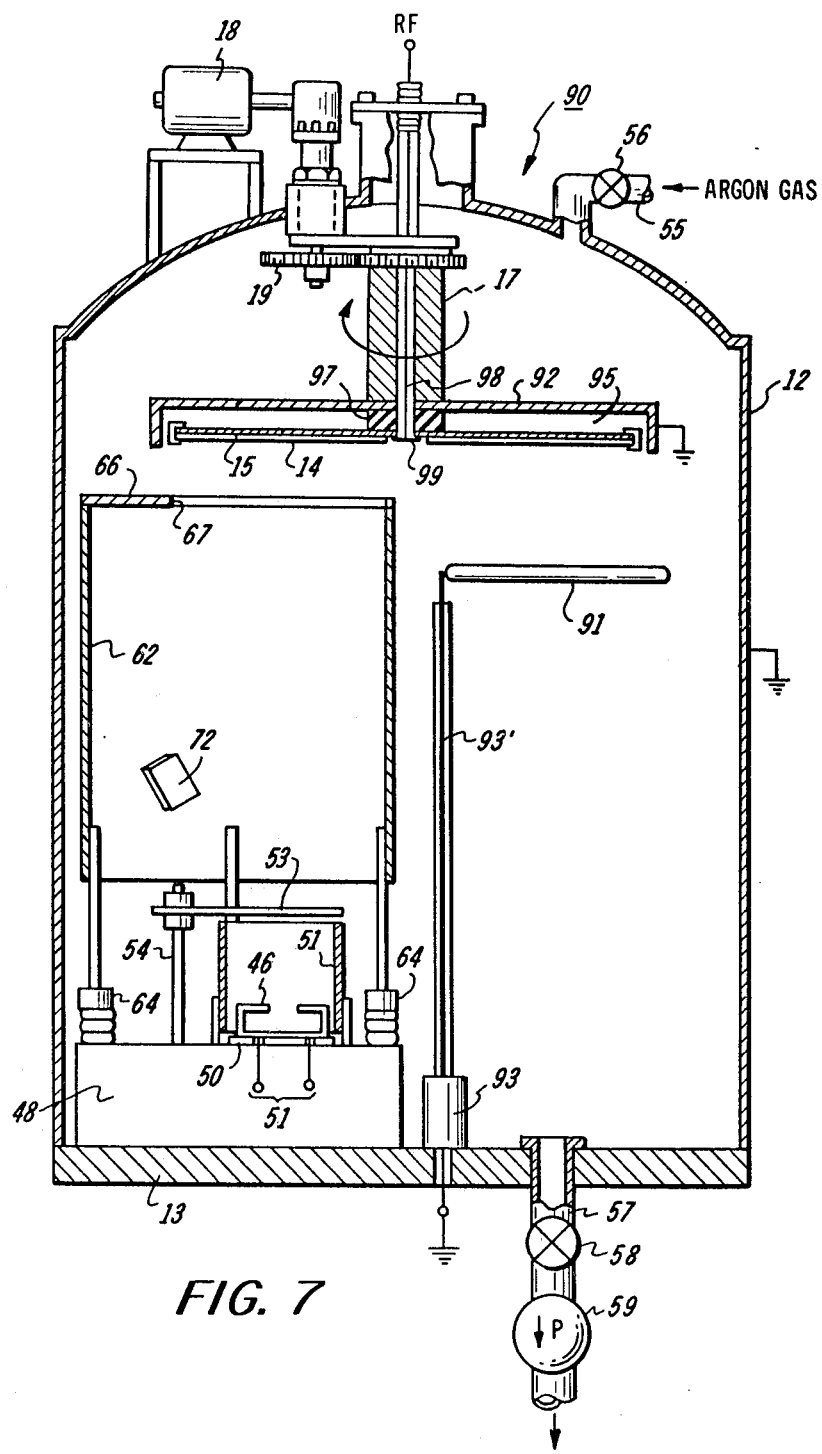
FIG. 7 is a cross-sectional view of still another embodiment of the apparatus for carrying out the method of this invention.

There are other means for providing the ion bombardment as a pretreatment for substrate surfaces. FIG. 7 discloses such other means in the form of apparatus 90 having in the pretreatment region, a rf sputtering system to provide argon ion bombardment or sputtering of the substrate surface. As compared to previous structures, only one electrode 91 is needed. Electrode 91 is supported by conductive rod 93' on member 93 which is secured to base 13. However, the dielectric substrate 14 must be capacitively coupled into the electrical operating system. For this purpose coupling plate 92 is supported by means of enlarged shaft 17 in bell jar 12. Bell jar 12 is preferrably made of metal such as, stainless steel.

An rf high voltage is applied to backing plate 15 by means of supply line 98 and annular bushing 99. Bushing 99 is spring loaded (not shown) to make good electrical contact with annular lip at the center of backing plate 15.

Backing plate 15 is insulated from ground shield plate 92 by means of an annular dielectric member 97.

The ground shield plate 92, electrode 91 and bell jar 12 are all grounded. The rf electrode is represented by backing plate 15 so that the area of this electrode is smaller compared to grounded electrode 91, plate 92 and bell jar 12. The spacing 95 between plates 15 and 92 is less than the plasma dark space.

By applying a rf high voltage to backing plate 15, an environment of argon ions and electrons is created with ions attracted to and accelerated into the surface of the rotating substrate 14.

Figure 8:
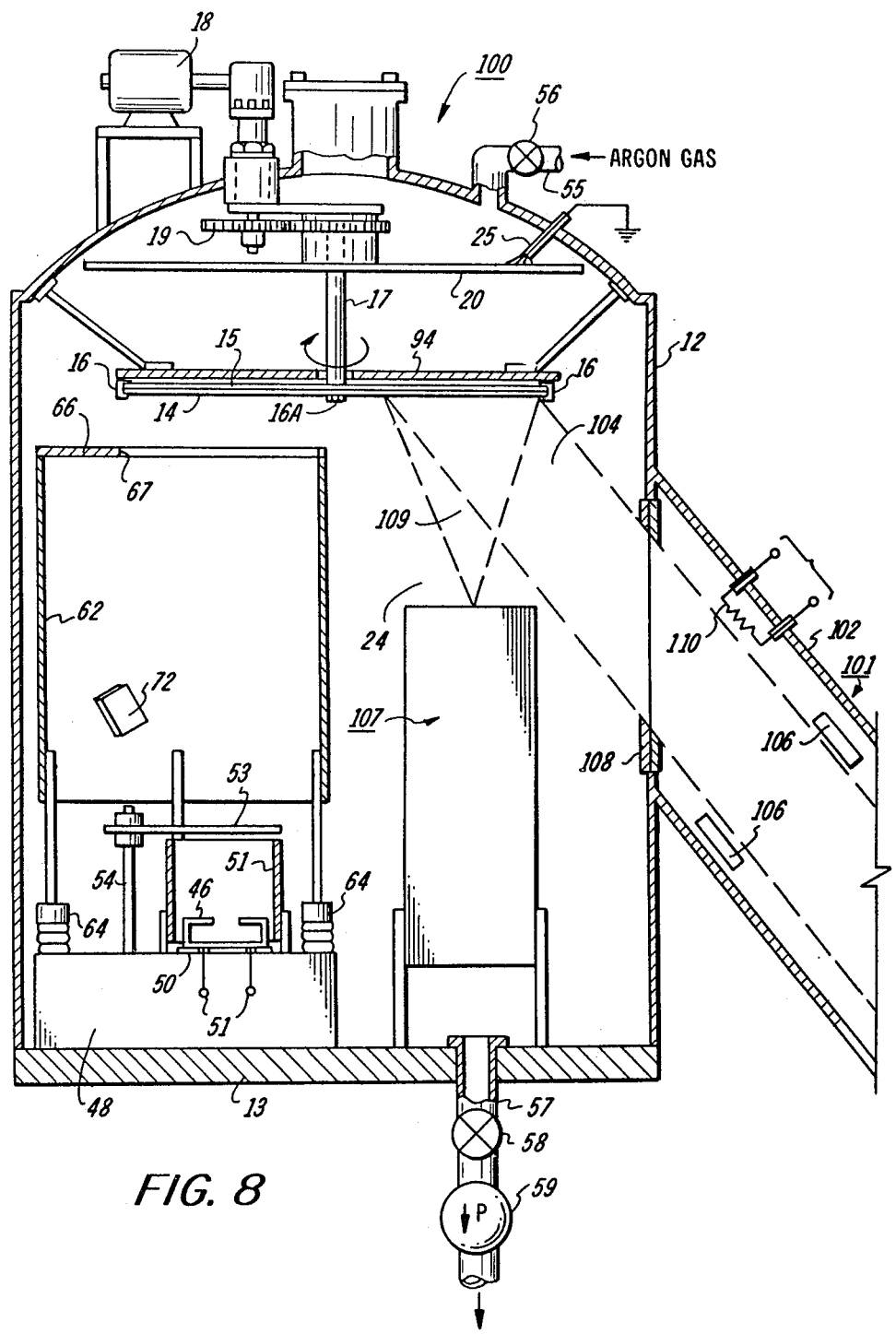
FIG. 8 is a cross-sectional view of still another embodiment of the apparatus for carrying out the method of this invention.

In FIG. 8, another embodiment is shown for providing the pretreatment step. Apparatus 100 is provided with ion beam source 101 having an angular housing 102 secured to the side wall of bell jar 12. Housing 102 contains an ion sputtering gun (not shown) that produces an ion beam 104. Beam 104 is focused by lens system 106 and may be collimated by aperture 108, although the collimating aperture 108 may be omitted. The beam 104 is accelerated with the necessary potential relative to ground to provide the argon ions with the necessary energy to intercept the substrate target. Filament 110 is heated by a suitable power source to emit electrons by thermionic emission to neutralize the positive ion beam and thereby prevent positive charge buildup on the surface of substrate 14. Also the electron emission from filament 110 contributes to collimation of the ion beam 104.

As an alternative to the ion beam source 101, the saddle field ion source 107 of the type manufactured by Ion Tech, Inc. may be employed. The source 107 provides a rectilinear shaped collimated output beam 109. The elongated extent of the beam impingement on the surface of the substrate 14 would be in line with the radius of the substrate.

The advantage of the saddle field ion source 107 is its compact size for placement in chamber 24.

Backplate 94 may be provided in chamber 24 behind substrate 14. This backplate is not essential to the operation of apparatus 100. The backplate 94 may be secured to ground.

The employment of collimated ion beams 104 or 109 may reduce the time necessary for pretreatment required by electrodes 26 and 28.

All of the previously described embodiments pertain to treatment of substrates that have a disk shaped geometry. This is because most optical recording mediums are disk shaped. However, the method disclosed is not limited to this particular geometry and may be applied to other types of substrate geometries. For example, a high vacuum continuous pretreatment and evaporation system can be employed. Such a system is schematically shown in FIG. 11 wherein pretreatment and deposition are carried out in a linear manner in chamber 111 of apparatus 110. The substrate material 112 having been precleaned, is placed in apparatus 110 in the form of feed reel 114. The substrate ribbon 112, after pretreatment and deposition is taken up on reel 116. As the surface 118 of ribbon 112 continuously moves through apparatus 110, it passes over one or more ion sputtering sources 120 for the purpose of creating continuous nucleation sites on the substrate surface by means of ion bombardment indicated at 122. The number of sources 120 depends upon the concentration and intensity of the ion beam produced and the rate of movement of ribbon 112. An argon gas flow is provided at inlet 119 to each ion source 120. Most of the gas leaves each source by the exit outlet 121. A small portion of the gas molecules provide the ions for bombardment but are evacuated by the chamber pump. The pressure of chamber 111, for example, may be in the $10^{-5}$ torr range while the gas pressure in each source might be $5 \times 10^{-3}$ torr.

After pretreatment, the ribbon 112 passes over the evaporation source 124 where the rate of deposition is controlled by both monitoring the rate of evaporation from source 124 and the rate of movement of ribbon 112 The processed ribbon 112 is then taken up on reel 116.

After deposition, the desired substrate geometry may be cut from the ribbon 112. To produce disk-shaped structures, a large annular cutter may be employed.

The method of this invention may also easily be practiced on pregrooved disc substrates which are being increasingly employed in optical disk recording and playback systems.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. A method for pretreating a glass or plastic surfaced article prior to the deposition of a thin film comprising a coating capable of being ablated upon intense radiation and wherein the molecular characteristic of the thin film to be deposited does not possess good reactive properties with the material of the article to insure an acceptable level of adhesion of the deposited film to the article comprising:
   providing a chamber,
   rotatably mounting the article in the chamber,
   evacuating the chamber,
   generating a source of high energy ions in the chamber, the energy distribution of the ions being greater than the energy threshold level necessary to induce sputtering of the article, said energy threshold level characteristic of the material comprising the article and
   focusing the generated ions into at least one ion beam for bombardment of the article surface and directing the generated ion beam to a sector of the article surface while rotating the article in the chamber, the bombardment of the ions being maintained for a period of time sufficient to create a plurality of nucleation sites uniformly over a majority of the bombarded article surface.

2. The method of claim 1 which includes the step of providing a source of electrons in proximity to said article surface outside of the article pretreatment section to aid in neutralizing the surface charge deposited on the article surface during the step of bombardment.

3. The method of claim 1 wherein the source of generated ions is produced from a plasma generated between a pair of planar cathode and anode electrodes, with a potential applied therebetween, the cathode electrode being positioned in close proximity to the article surface.

4. The method of claim 1 wherein the source of generated ions is generated from an rf sputtering system.

5. The method of claim 1 wherein the source of generated ions is generated from either an ion sputtering gun or a saddle field ion source.

6. In the manufacture of optically sensitive mediums for optical recording and playback, a method of pretreating and forming a thin film comprising a coating capable of being ablated upon intense radiation, said film of less than 300 A in thickness on the surface of a glass or plastic surfaced article, said film being of uniform thickness, pin-hole free with improved film adhesion and resistance to abrasion comprising the steps of
   providing a chamber having an article pretreatment section and an article vapor deposition section,
   rotatably mounting the article in the chamber,
   evacuating the chamber,
   generating a source of high energy ions in the chamber, the energy distribution of the ions being greater than the energy threshold level necessary to induce sputtering of the article, said energy threshold level characteristic of the material comprising the article,
   focusing the generated ions into at least one ion beam for bombardment of the article surface and directing the ion beam to a sector of the article surface while rotating the article in the chamber, the bombardment of the ions being maintained for a period of time sufficient to create a plurality of nucleation sites uniformly over a majority of the article surface,
   extinguishing the ion bombardment and evacuating the chamber, and
   vapor depositing said coating on a sector of the nucleated article surface while rotating the article in the chamber whereby a thin film is uniformly deposited on the nucleated article surface.

7. The method of claim 6 wherein the source of generated ions is produced from a plasma generated between a pair of planar cathode and anode electrodes, with a potential applied therebetween, the cathode electrode being positioned in close proximity to the article surface.

8. The method of claim 6 wherein the source of generated ions is generated from an rf sputtering system.

9. The method of claim 6 wherein the source of generated ions is generated from either an ion sputtering gun or a saddle field ion source.

10. The method of claim 6 which includes the step of providing a source of electrons in proximity to said article surface outside of the article pretreatment section to aid in neutralizing the surface charge deposited on the article surface during the step of bombardment.

11. In the manufacture of optically sensitive mediums for optical recording and playback, a method of pretreating and forming a thin film of tellurium or its alloys of less than 300 A in thickness on the surface of a glass or plastic surfaced article, said film being of uniform thickness, pin-hole free with improved film adhesion and resistance to abrasion and oxidation to minimal film thicknesses of about 25 A and comprising the steps of
   providing a chamber having an article pretreatment section and an article vapor deposition section,
   rotatably mounting the article in the chamber,
   evacuating the chamber and introducing a working gas into the chamber,
   establishing a plasma in the chamber,
   maintaining a working gas flow through the chamber while lowering the chamber pressure by continuous chamber evacuation while increasing the voltage supplied to the plasma whereby the energy distribution in the gas ions established in said plasma is greater than the energy threshold level necessary to induce sputtering of the article, said energy threshold level characteristic of the material comprising the article,
   focusing the generated ions into a plurality of ion beams for bombardment of the article surface and directing the ion beams to a sector of the article surface while rotating the article in the chamber, the bombardment of the ions being maintained for a period of time sufficient to create a plurality of nucleation sites uniformly over a majority of the article surface,
   extinguishing said plasma and evacuating the chamber of the working gas, and
   vapor depositing said thin film on a sector of the nucleated article surface while rotating the article in the chamber whereby said thin film is uniformly deposited on the nucleated article surface with the tellurium or the tellurium alloy polycrystallites having their C-axis orientation in the plane of the article.

12. The method of claim 11 which includes the step of providing a source of electrons in proximity to said article surface outside of the article pretreatment section to aid in neutralizing the surface charge deposited on the article surface during the step of bombardment.

13. An optical recording medium comprising a thin film comprising a coating capable of being ablated upon intense radiation having a thickness in the range of 25 A to 300 A deposited on a surface of said article in accordance with the method of any one of the method claims 6, 7 and 10.

14. An optical recording medium comprising a thin film of tellurium or alloy thereof within the range of 25 A to 300 A deposited on a surface of said article in accordance with the method of claim 11.

15. Apparatus for the pretreatment of a surface of a support medium prior to deposition of a thin film on said surface comprising
a chamber,
means in said chamber to rotatably support said medium including drive means to rotate said medium at a desired rotational speed,
a first electrode supported in said chamber adjacent to said medium surface, said first electrode having a planar extent that is in a plane substantially parallel to the plane of said medium and adapted to cover only a sector of said medium surface, said first electrode being a cathode,
a second electrode supported in said chamber in spaced relation from said first electrode, said second electrode having a planar extent substantially parallel to said first electrode, said second electrode being an anode,
means to evacuate said chamber and introduce and maintain a working gas flow through said chamber as said chamber is continuously evacuated,
means to apply a potential between said electrodes to generate a plasma therebetween,
means to control the pressure in said chamber and the amount of said potential whereby the energy distribution in the gas ions established in said plasma is greater than the energy threshold level necessary to induce sputtering of the medium surface, said energy level characteristic of the material comprising said medium, whereby ions from said plasma bombard and sputter said medium sector surface through said first electrode as said medium is rotated in said chamber to create a plurality of nucleation sites uniformly over a majority of said medium surface.

16. The apparatus of claim 15 which includes means at said electrodes to produce a plurality of ion beams for bombardment of said medium surface sector.

17. The apparatus of claim 15 wherein each of said electrodes includes a plurality of parallel grids in the planar extent thereof, the grids of said first electrodes being disposed at an angle transverse to the grids of said second electrode to cause focusing of said ions into a plurality of beams for bombardment of said medium surface sector.

18. The apparatus of claim 17 wherein said electrodes are of annular shape.

19. The apparatus of claim 15 wherein said chamber is divided into two sections, said electrodes supported in one section, vapor deposition means in the other section and including an evaporation source and means between said evaporation source and said medium to confine vapor issuing from said evaporation source to a sector of said medium surface whereby said vapor is uniformly deposited on said medium surface as said medium is rotated in said chamber.

20. The apparatus of claim 19 wherein said evaporation source is tellurium or an alloy thereof.

21. Apparatus for the pretreatment of a surface of a support medium prior to the depositing of a thin film of a material on said surface wherein the molecular characteristic of the material to be deposited does not possess good reactive properties with the material of the support medium to insure an acceptable level of adhesion of the deposited film to the support medium comprising
a chamber,
means in said chamber to rotatably support said medium including drive means to rotate said medium at a desired rotational speed,
means to evacuate said chamber,
a source of high energy ions in said chamber, the energy distribution of the ions being greater than the energy threshold level necessary to induce sputtering of the medium, said energy threshold level characteristic of the material comprising the support medium,
means to focus ions generated from said source to only a sector of the medium surface whereby ions from said source bombard and sputter said medium sector surface as said medium is rotated in said chamber to create a plurality of nucleation sites uniformly over a majority of said medium surface.

22. The apparatus of claim 21 wherein said ion source comprises a pair of electrodes supported in spaced parallel relation in said chamber, the planar extent of said electrodes in a plane substantially parallel to the plane of said medium, one of said electrodes positioned in close proximity to said medium surface and adapted to cover only a sector of said medium surface, and
means to apply a potential between said electrodes to generate a plasma therebetween.

23. The apparatus of claim 21 wherein said ion source comprises an rf sputtering system.

24. The apparatus of claim 21 wherein said ion source comprises an ion sputtering gun.

25. The apparatus of claim 21 wherein said ion source comprises a saddle field ion source.

26. The apparatus of claim 21 which includes a source of electrons adjacent to said source of high energy ions and in proximity to said medium surface to aid in neutralizing the surface charge deposited on said medium surface during ion bombardment and sputtering thereof.

27. The apparatus of claim 21 wherein said chamber is divided into two sections comprising a pretreatment section and a vapor deposition section, said vapor deposition section includes an evaporation source, means between said evaporation source and said medium to confine vapor issuing from said evaporation source to a sector of said nucleated medium surface whereby said vapor is uniformly deposited on said medium surface as said medium is rotated in said chamber.

28. The apparatus of claim 27 wherein said evaporation source is tellurium or an alloy thereof.

* * * * *